United States Patent
Ishikawa

(10) Patent No.: US 8,493,503 B2
(45) Date of Patent: Jul. 23, 2013

(54) IMAGING APPARATUS

(75) Inventor: Koji Ishikawa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 393 days.

(21) Appl. No.: 12/731,519

(22) Filed: Mar. 25, 2010

(65) Prior Publication Data

US 2010/0245662 A1    Sep. 30, 2010

(30) Foreign Application Priority Data

Mar. 27, 2009   (JP) ................................ 2009-079209

(51) Int. Cl.
*H04N 5/225* (2006.01)
*H04N 5/335* (2006.01)

(52) U.S. Cl.
USPC ........................... 348/373; 348/374; 348/294

(58) Field of Classification Search
USPC ................... 348/373, 374, 375, 376, 207.99, 348/294; 257/433
See application file for complete search history.

(56) References Cited

U.S. PATENT DOCUMENTS

| | | | |
|---|---|---|---|
| 2001/0010562 A1* | 8/2001 | Nakagishi et al. | 348/374 |
| 2002/0140837 A1* | 10/2002 | Miyake et al. | 348/340 |
| 2003/0025824 A1 | 2/2003 | Ishikawa | |
| 2003/0081136 A1 | 5/2003 | Kobayashi | |
| 2006/0056049 A1* | 3/2006 | Tokiwa et al. | 359/684 |
| 2009/0046184 A1* | 2/2009 | Ma et al. | 348/294 |
| 2009/0237537 A1* | 9/2009 | Maruyama et al. | 348/294 |
| 2009/0303360 A1* | 12/2009 | Huang | 348/294 |

FOREIGN PATENT DOCUMENTS

| | | |
|---|---|---|
| CN | 101299433 A | 11/2008 |
| CN | 101374201 A | 2/2009 |
| JP | 11-261904 | 9/1999 |
| JP | 2003-204457 | 7/2003 |

* cited by examiner

*Primary Examiner* — Chieh M Fan
*Assistant Examiner* — Peter Chon
(74) *Attorney, Agent, or Firm* — Canon USA Inc IP Division

(57) ABSTRACT

An imaging apparatus includes a photoelectric conversion element package, a chassis member arranged at a position opposite a rear surface of the photoelectric conversion element package, a wiring member electrically connected to the photoelectric conversion element package. The wiring member has an opening that exposes the rear surface of the photoelectric conversion element package. The wiring member is arranged between the rear surface of the photoelectric conversion element package and the chassis member. The imaging apparatus further includes a heat conduction member configured to contact the rear surface of the photoelectric conversion element package, exposed by the opening, and the chassis member.

11 Claims, 17 Drawing Sheets

IMAGING APPARATUS

BACKGROUND OF THE INVENTION

1. Field of the Invention

The present invention relates to an imaging apparatus having a photoelectric conversion element package and a mechanism to adjust an inclination to an optical axis orthogonal plane (a plane orthogonal to an optical axis) thereof, and in particular, relates to an imaging apparatus configured to dissipate heat of a photoelectric conversion element package.

2. Description of the Related Art

In an imaging apparatus such as a digital camera, necessity to align a light receiving surface of a photoelectric conversion element with an image forming plane of a photographic lens optical system with higher precision is generally increasing with an increasing number of pixels in the photoelectric conversion element mounted inside the apparatus body.

Thus, an imaging apparatus is required to include a mechanism capable of adjusting the position of a photoelectric conversion element relative to a lens barrel.

Therefore, a conventional imaging apparatus is provided with a fixing member to regulate the position of a photoelectric conversion element package in an optical axis direction of the lens barrel. Then, after the photoelectric conversion element package is fixed to the fixing member, a relative position in the optical axis direction between the lens barrel and the fixing member is fine-adjusted. This allows alignment of the light receiving surface of a photoelectric conversion element with the image forming plane of a photographic lens optical system with higher precision.

Further, the reduction in total thickness of a photoelectric conversion element package, a fixing member, and a printed circuit board on which the photoelectric conversion element package is mounted has been desired to make an imaging apparatus smaller and thinner.

Thus, a conventional imaging apparatus uses a leadless-type photoelectric conversion element package. Moreover, as illustrated in FIGS. 1 and 7 in Japanese Patent Application Laid-Open No. 11-261904, a proposal is made to regulate the positions of a photoelectric conversion element package and a fixing member by arranging a printed circuit board between the photoelectric conversion element package and the fixing member.

In recent imaging apparatuses, heat generated by a photoelectric conversion element increases with an increasing processing speed of the photoelectric conversion element, thus causing a temperature rise of the photoelectric conversion element. Noise caused by a dark current of a photoelectric conversion element generally increases with a rising temperature and thus, it is required to reduce or suppress the rise in temperature of the photoelectric conversion element to achieve high quality of photographed images.

To address this issue, Japanese Patent Application Laid-Open No. 2003-204457 discusses an imaging apparatus provided with a mechanism to cause dissipation of heat generated by a photoelectric conversion element to suppress the rise in temperature of the photoelectric conversion element.

However, a conventional imaging apparatus includes an inclination adjustment mechanism capable of making inclination adjustments of a photoelectric conversion element relative to the optical axis orthogonal plane of the lens barrel. The inclination adjustment mechanism has a fixing member to regulate the position of a photoelectric conversion element package in the optical axis direction arranged on a rear surface of the photoelectric conversion element package.

An imaging apparatus including such an inclination adjustment mechanism has the fixing member halfway through a heat dissipation path to dissipate heat from the photoelectric conversion element.

The fixing member is configured to be in point contact with the photoelectric conversion element package via protruding portions to regulate the position to the photoelectric conversion element package. Thus, in this structure, a portion of the heat dissipation path to dissipate heat from the photoelectric conversion element transmits heat only through the protruding portions in point contact and thus, the efficiency of heat dissipation of the photoelectric conversion element may decrease.

Moreover, when heat from the photoelectric conversion element is dissipated via the fixing member, it is required to configure the fixing member so that the function to make inclination adjustments to the optical axis orthogonal plane of the lens barrel of the photoelectric conversion element does not become impaired. Thus, when heat from the photoelectric conversion element is dissipated via the fixing member, it is difficult to construct a robust heat dissipation path.

SUMMARY OF THE INVENTION

According to an aspect of the present invention, an imaging apparatus includes a photoelectric conversion element package, a chassis member arranged at a position opposite a rear surface of the photoelectric conversion element package, a wiring member electrically connected to the photoelectric conversion element package, wherein the wiring member has an opening that exposes the rear surface of the photoelectric conversion element package, and the wiring member is arranged between the rear surface of the photoelectric conversion element package and the chassis member, and a heat conduction member configured to contact the rear surface of the photoelectric conversion element package, exposed by the opening, and the chassis member.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 7A is a plan view of the photoelectric conversion element package, FIG. 7B a side view thereof, and FIG. 7C a bottom view thereof.

DESCRIPTION OF THE EMBODIMENTS

Various exemplary embodiments, features, and aspects of the invention will be described in detail below with reference to the drawings.

Figure 1:
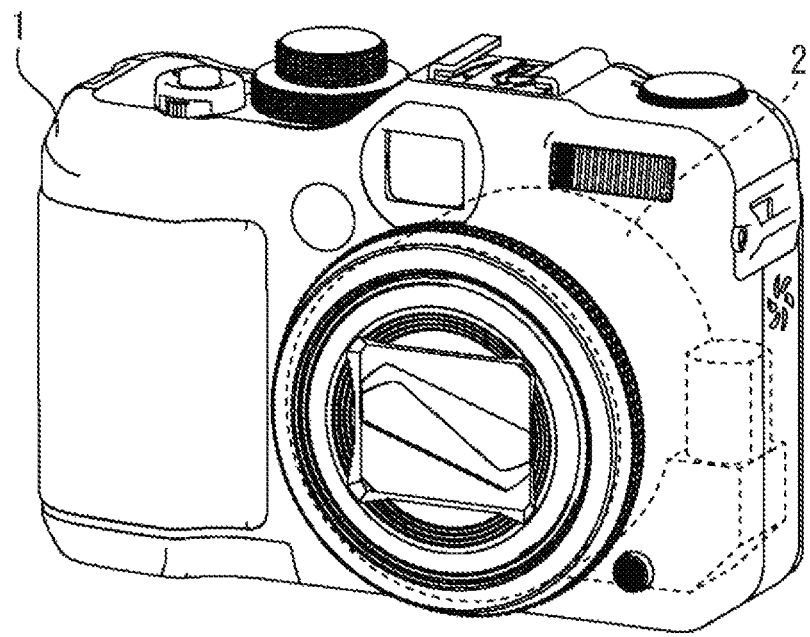
FIG. 1 is an outside perspective view of a digital camera as an imaging apparatus according to a first exemplary embodiment of the present invention when viewed from the front.
Figure 2:
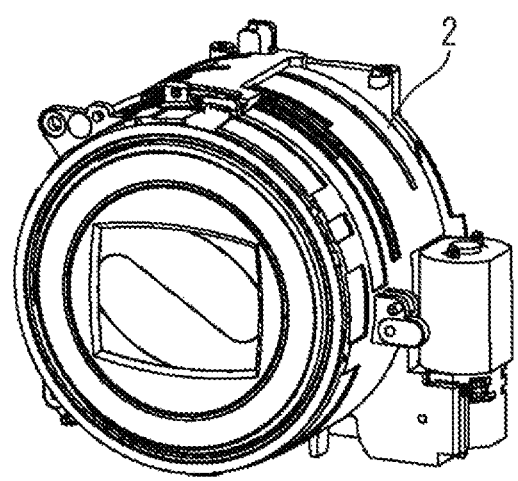
FIG. 2 is a perspective view illustrating an imaging unit in the digital camera according to the first exemplary embodiment when viewed from a front side.
Figure 3:
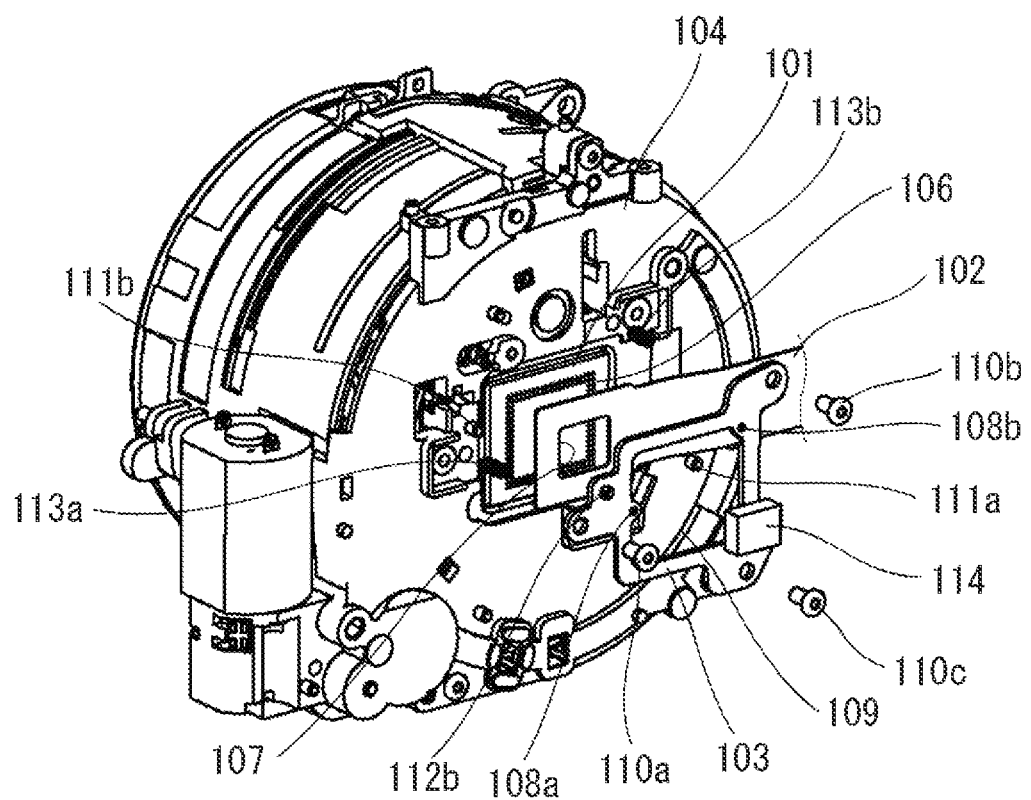
FIG. 3 is an exploded perspective view illustrating the imaging unit in the digital camera according to the first exemplary embodiment when viewed from a rear surface.
Figure 4:
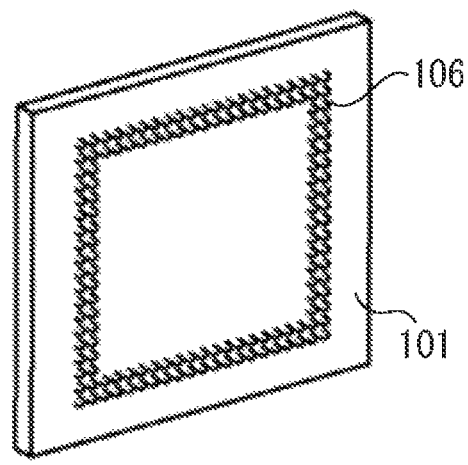
FIG. 4 is a perspective view of the rear surface of a photoelectric conversion element package in the imaging unit of the digital camera according to the first exemplary embodiment.
Figure 5:
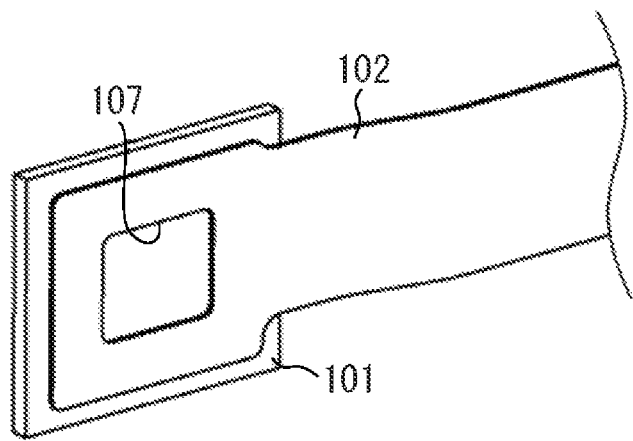
FIG. 5 is a perspective view illustrating a mounted state of the photoelectric conversion element package in the imaging unit of the digital camera according to the first exemplary embodiment.
Figure 6:
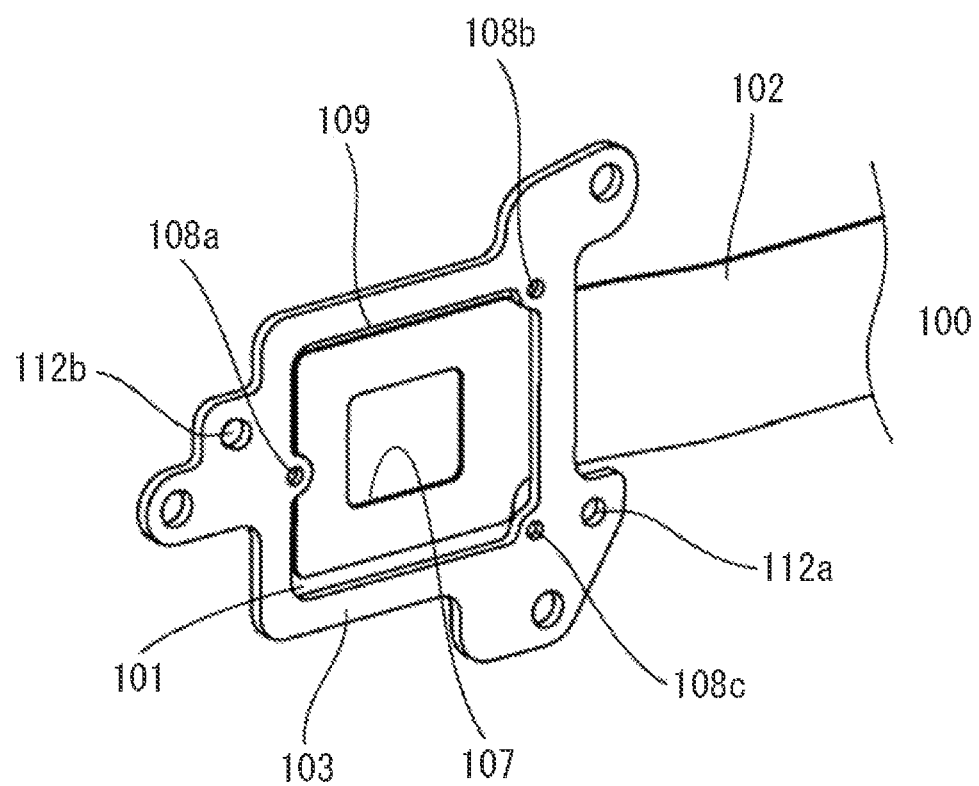
FIG. 6 is a perspective view illustrating a state in which the photoelectric conversion element package in the imaging unit of the digital camera according to the first exemplary embodiment and a fixing member are fixed.
Figure 7A:
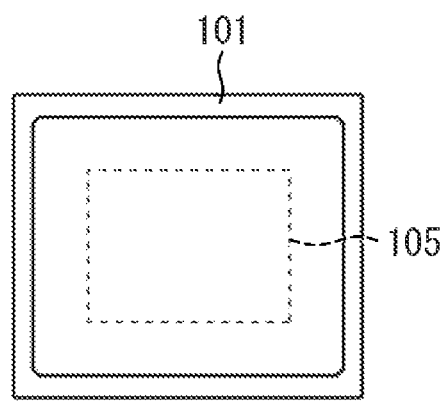
FIGS. 7A to 7C illustrate a configuration of the photoelectric conversion element package in the imaging unit of the digital camera according to the first exemplary embodiment.
Figure 7B:
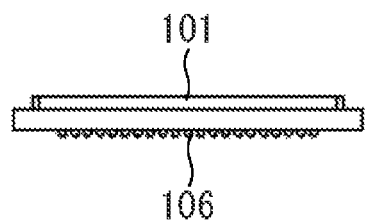
Figure 7C:
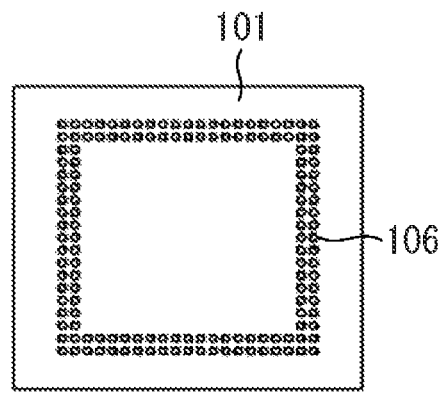
Figure 8:
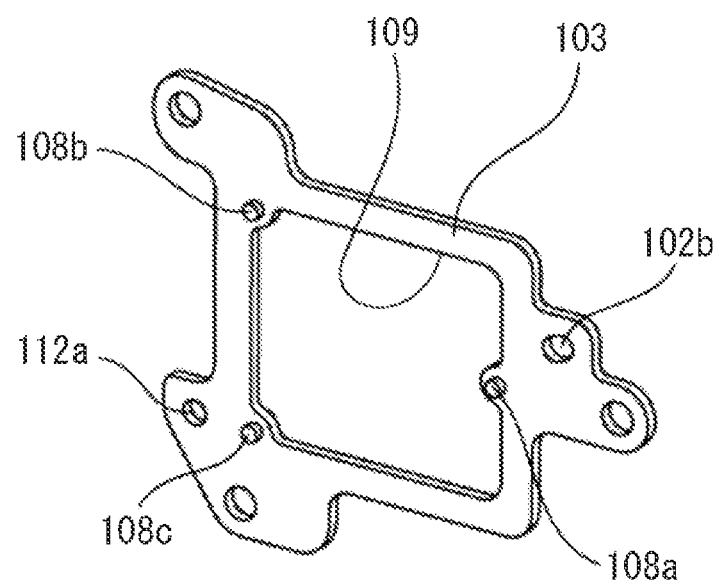
FIG. 8 is a perspective view illustrating the fixing member in the imaging unit of the digital camera according to the first exemplary embodiment.
Figure 9:
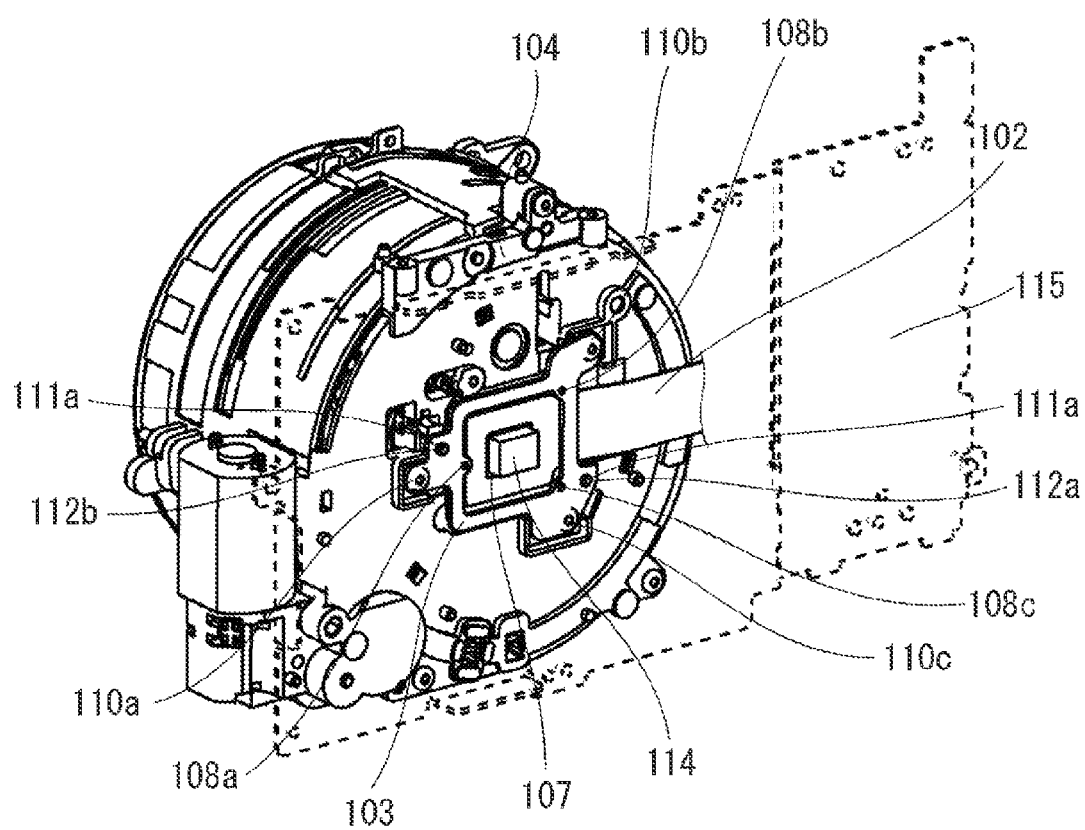
FIG. 9 is a perspective view illustrating an assembly complete state of the imaging unit of the digital camera according to the first exemplary embodiment.

FIG. 1 is an outside perspective view of a digital camera as an imaging apparatus according to a first exemplary embodiment of the present invention when viewed from the front. FIG. 2 is a perspective view illustrating an imaging unit in the digital camera according to the first exemplary embodiment when viewed from the front side. FIG. 3 is an exploded perspective view illustrating the imaging unit in the digital camera according to the first exemplary embodiment when viewed from the rear surface. FIG. 4 is a perspective view of the rear surface of a photoelectric conversion element package in the imaging unit of the digital camera according to the first exemplary embodiment. FIG. 5 is a perspective view illustrating the mounted state of the photoelectric conversion element package in the imaging unit of the digital camera according to the first exemplary embodiment. FIG. 6 is a perspective view illustrating the state in which the photoelectric conversion element package in the imaging unit of the digital camera according to the first exemplary embodiment and a member for position regulation are fixed. FIGS. 7A to 7C illustrate the configuration of the photoelectric conversion element package in the imaging unit of the digital camera according to the first exemplary embodiment. FIG. 7A is a plan view of the photoelectric conversion element package, FIG. 7B a side view thereof, and FIG. 7C a bottom view thereof. FIG. 8 is a perspective view illustrating the member for position regulation in the imaging unit of the digital camera according to the first exemplary embodiment. FIG. 9 is a perspective view illustrating the assembly complete state of the imaging unit of the digital camera according to the first exemplary embodiment.

In FIG. 1, the main body of a digital camera is illustrated. The digital camera 1 has an imaging unit 2 mounted therein in such a way that a front portion thereof is exposed through an opening provided substantially in a center portion of the front exterior of the digital camera 1.

As illustrated in FIG. 3, the imaging unit 2 includes a photoelectric conversion element package 101, a photoelectric conversion element module unit 100 including a printed circuit board 102 as a wiring member and a fixing member 103, and a photographic lens barrel unit 104.

An opening 107 opened in a rectangular shape is provided at a position corresponding to substantially the rear center position of the photoelectric conversion element package 101 in amounting part of the photoelectric conversion element package 101 of the printed circuit board 102. A heat conduction member 114 is arranged inside the opening 107 to contact the rear surface of the photoelectric conversion element package 101. The heat conduction member 114 is a member formed of a heat-conductive gel material with flexibility in a rectangular solid shape. More specifically, the heat conduction member 114 is arranged to contact both the rear center portion of the photoelectric conversion element package 101 and a main chassis 115 arranged opposite thereto to become a chassis member and constitutes a heat conduction path to dissipate heat of the photoelectric conversion element package 101.

Next, the configuration of the photoelectric conversion element module unit 100 will be described according to the assembly process with reference to FIGS. 4, 5, 6, and 7A to 7C.

As illustrated in FIGS. 4 and 7A to 7C, the photoelectric conversion element package 101 is configured as a package that accommodates a photoelectric conversion element 105.

The photoelectric conversion element package 101 is a ball grid array (BGA) type package having an electrode 106 made of solder balls arranged like a grid formed on the rear surface thereof.

First, as illustrated in FIG. 5, the photoelectric conversion element package 101 is mounted on the printed circuit board 102. The printed circuit board 102 has a land (not illustrated) at a position corresponding to the electrode 106 of the photoelectric conversion element package 101 formed thereon. The photoelectric conversion element package 101 is reflow-mounted on the printed circuit board 102. In the reflow-mounting, solder balls forming the electrode 106, which is a connection terminal of the photoelectric conversion element package 101, are melted and firmly fixed to the land formed on the printed circuit board 102 for electric connection.

The printed circuit board 102 has the photoelectric conversion element package 101 of the BGA type mounted thereon and thus, high wiring densities are required. Moreover, as described below, the printed circuit board 102 is required to be configured to be able to align the photoelectric conversion element with the image forming plane of the photographic lens optical system. Thus, a wire leading part of the printed circuit board 102 is required to have a high degree of flexibility to connect from the printed circuit board 102 to another circuit board (not illustrated).

The printed circuit board 102 is provided on a multi-layer rigid flexible printed wiring board. Then, in the printed circuit board 102, a mounting part of the photoelectric conversion element package 101 that requires high wiring densities is configured as a rigid part and a wire leading part that requires flexibility as a flexible part.

As illustrated in FIG. 5, the outermost external shape of the mounting part of the photoelectric conversion element package 101 of the printed circuit board 102 is formed smaller than that of the photoelectric conversion element package 101. Accordingly, the photoelectric conversion element package 101 is mounted on the printed circuit board 102 in such a way that the rear surface of the photoelectric conversion element package 101 is exposed outside the external shape of the printed circuit board 102.

Next, the photoelectric conversion element package 101 mounted on the printed circuit board 102 is integrated by an outer circumferential part thereof being positioned and adhesion-fixed to the fixing member 103 formed in a frame shape in a state illustrated in FIG. 6. As illustrated in FIG. 8, the fixing member 103 is configured as a plate made of metal substantially in a frame shape having an opening 109 formed in the center portion thereof. The fixing member 103 has protruding portions 108a to 108c to regulate the position of the photoelectric conversion element package 101 in the optical axis direction by being bumped against the outer circumferential part on the package rear surface of the photoelectric conversion element package 101 formed by half blanking.

These protruding portions 108a to 108c are formed at positions in contact with an outside portion of the external shape of the printed circuit board 102 on the rear surface of the photoelectric conversion element package 101 in a mounted state. Thus, the protruding portions 108a to 108c directly contact the rear surface of the photoelectric conversion element package 101. Incidentally, protruding portions may be arranged at more than three locations on the rear surface of the photoelectric conversion element package 101. The opening 109 is formed smaller than the external shape of the photoelectric conversion element package 101 and larger than the opening 107 of the printed circuit board 102.

The fixing member 103 configured as described above does not interfere with the heat conduction member 114 in contact with the rear surface of the photoelectric conversion element package 101 through the opening 107. At the same time, the fixing member 103 can secure a mutual margin to adhere by providing an area where the outer circumferential part on the rear surface of the photoelectric conversion element package 101 and the fixing member 103 overlap. Moreover, work to flow an adhesive from the opening 109 to the margin to adhere is easy.

The fixing member 103 in the present exemplary embodiment is made of metal, but an equivalent effect can be achieved by a resin mold product if the resin mold product has sufficient strength.

Next, before the photoelectric conversion element package 101 and the fixing member 103 are fixed, first the relative position to the plane direction orthogonal to the optical axis of the photoelectric conversion element package 101 is determined using a tool (not illustrated).

Next, the relative position in the optical axis direction of the photoelectric conversion element package 101 is determined by bumping the protruding portions 108a to 108c formed on the fixing member 103 against the outer circumferential part on the rear surface of the positioned photoelectric conversion element package 101.

Next, in this positioned state, an adhesive is poured into a gap between the outer circumferential part of the positioned photoelectric conversion element package 101 and the fixing member 103 from an outside portion of the external shape of the printed circuit board 102 in the opening 109 formed in the fixing member 103.

Here, the photoelectric conversion element package 101 is configured to be able to directly regulate the position in the optical axis direction by the protruding portions 108a to 108c of the fixing member 103 while being mounted on the printed circuit board 102.

Thus, the protruding portions 108a to 108c are made higher than a distance between the package rear surface of the photoelectric conversion element package 101 after the photoelectric conversion element package 101 is mounted on the printed circuit board 102 and the rear surface of the printed circuit board 102. The protruding portions 108a to 108c are formed at positions in the outer circumferential part on the rear surface of the photoelectric conversion element package 101 that contact an outside portion of the external shape of the printed circuit board 102. With such a configuration, intervals between the protruding portions 108a to 108c can be made maximally wide within the range of the rear surface of the photoelectric conversion element package 101.

Thus, fluctuations in plane position of the photoelectric conversion element 105 can be minimized to fluctuations in height of the protruding portions 108a to 108c due to working, enabling position regulation with high precision.

The height of the protruding portions 108a to 108c can be set with precision as high as the precision with which the interval between the rear surface of the photoelectric conversion element package 101 and the rear surface of the printed circuit board 102 with the photoelectric conversion element package 101 mounted on the rear surface of the printed circuit board 102 is set. Thus, the total thickness from the photoelectric conversion element package 101 to the fixing member 103 can be minimized.

Next, as illustrated in FIG. 9, the integrated photoelectric conversion element module unit 100 is fastened to the photographic lens barrel unit 104 by screws 110a to 110c with the posture thereof positioned by a positioning mechanism.

As illustrated in FIG. 3, the positioning mechanism engages positioning protruding portions 111a and 111b projecting from the photographic lens barrel unit 104 with positioning holes 112a and 112b formed in the fixing member 103 for positioning, respectively. This positioning mechanism positions the posture (position) of the fixing member 103 and the photoelectric conversion element package 101 to the photographic lens barrel unit 104 in the direction of a plane orthogonal to the optical axis thereof.

The positioning mechanism has a plurality of biasing springs 113a, 113b, and the like (there is still another biasing spring that is not illustrated) arranged in a recess of the photographic lens barrel unit 104. The plurality of biasing springs 113a, 113b, and the like is configured to bias the fixing member 103 to the screw head of the screws 110a to 110c in the optical axis direction.

The positioning mechanism fine-adjusts the posture such as the position in the optical axis direction of the fixing member 103 to the photographic lens barrel unit 104 and the angle to the optical axis by fine-adjusting the tightening amount of each of the screws 110a to 110c. If the positioning mechanism configured in this manner is used, the light receiving surface of the photoelectric conversion element 105 can be aligned with the image forming plane of the photographic lens optical system of the photographic lens barrel unit 104 with high precision.

Next, the photographic lens barrel unit 104, in which the posture is positioned by the positioning mechanism, is incorporated into the body of the digital camera 1. Then, the heat conduction member 114 in contact with the rear surface of the photoelectric conversion element package 101 through the opening 107 of the printed circuit board 102 is set to a state in which the heat conduction member 114 is in contact with the main chassis 115, which acts as a heat dissipation member to dissipate heat of the photoelectric conversion element package 101. The heat conduction member 114 is a member rich in flexibility and is configured to have a thickness that allows the heat conduction member 114 to be compressed and sandwiched between the photoelectric conversion element package 101 and the main chassis 115 to be a heat dissipation member. In addition to the main chassis 115, the heat dissipation member may include a portion of the housing of the digital camera 1, a structural member, or a member dedicated to heat dissipation separately arranged for heat dissipation.

Thus, when the heat conduction member 114 is used, heat can be dissipated from the photoelectric conversion element package 101 to the main chassis 115 via the heat conduction member 114 and, therefore, heat can be transmitted and dissipated highly efficiently. For example, when compared with a case where the heat conduction member is arranged between the fixing member 103 and the main chassis 115, a greater effect of heat dissipation is achieved when the heat conduction member 114 is arranged between the photoelectric conversion element package 101 and the main chassis 115.

The heat conduction member 114 is arranged in a wide space from the rear surface of the photoelectric conversion element package 101 to the main chassis 115 to pass through the opening 107 of the printed circuit board 102 and the opening 109 of the fixing member 103. Thus, even if the photoelectric conversion element package 101 is displaced by the positioning so that the photoelectric conversion element package 101 is no longer parallel to the surface of the main chassis 115, the heat conduction member 114 can be arranged in a state in which the thickness thereof is increased and the conduction member 114 is flexibly deformed. If the heat conduction member 114 rich in flexibility and molded by increasing the thickness thereof is used, an influence on an adjustment state of the light receiving surface of the photoelectric conversion element 105 aligned with the image forming plane of the photographic lens optical system with high precision can be reduced.

Moreover, in the digital camera 1, a positioning mechanism for the photoelectric conversion element 105 is configured such that the photoelectric conversion element 105 is supported by the fixing member outside the photoelectric conversion element package 101.

In contrast, the heat conduction member 114 is arranged substantially in the center portion on the rear surface of the photoelectric conversion element package 101. If configured in this manner, an influence of a repulsive force of the compressed heat conduction member 114 on a state in which the inclination to the optical axis of the photoelectric conversion element 105 is adjusted can be reduced.

In the digital camera 1 configured as described above, a photoelectric conversion element package and a fixing member can be positioned with high precision. Moreover, heat can be efficiently dissipated from a photoelectric conversion element in the digital camera 1 without affecting inclination adjustments to the optical axis orthogonal plane of the photoelectric conversion element so that the rise in temperature of the photoelectric conversion element can be suppressed.

The photoelectric conversion element package 101 is a package of the ball grid array (BGA) type in the first exemplary embodiment described above, but a package of the land grid array (LGA) type may also be configured. The configuration of the first exemplary embodiment can be applied to, instead of a package of the rear surface electrode type, a package of the type having an electrode on two opposite sides, though an electrode is formed on a side of the side surface.

Figure 15:
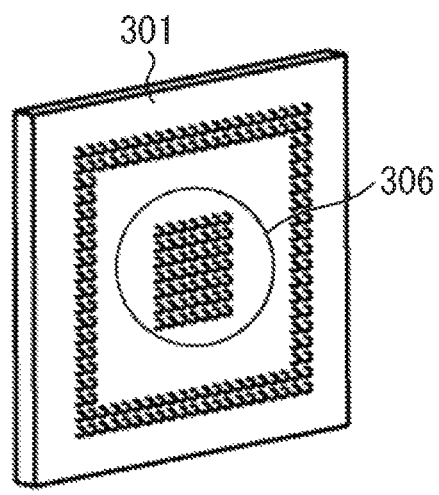
FIG. 15 is a perspective view illustrating the photoelectric conversion element package according to a different configuration of the imaging unit according to the first and second exemplary embodiments.

The heat conduction member 114 is arranged directly on the rear surface of the photoelectric conversion element package 101 in the first exemplary embodiment, but as illustrated in FIG. 15, a package in which an electrode 306 (heat dissipation portion), which is a connection terminal for heat dissipation, is provided in the center portion on the rear surface of the photoelectric conversion element package may also be used.

Figure 16:
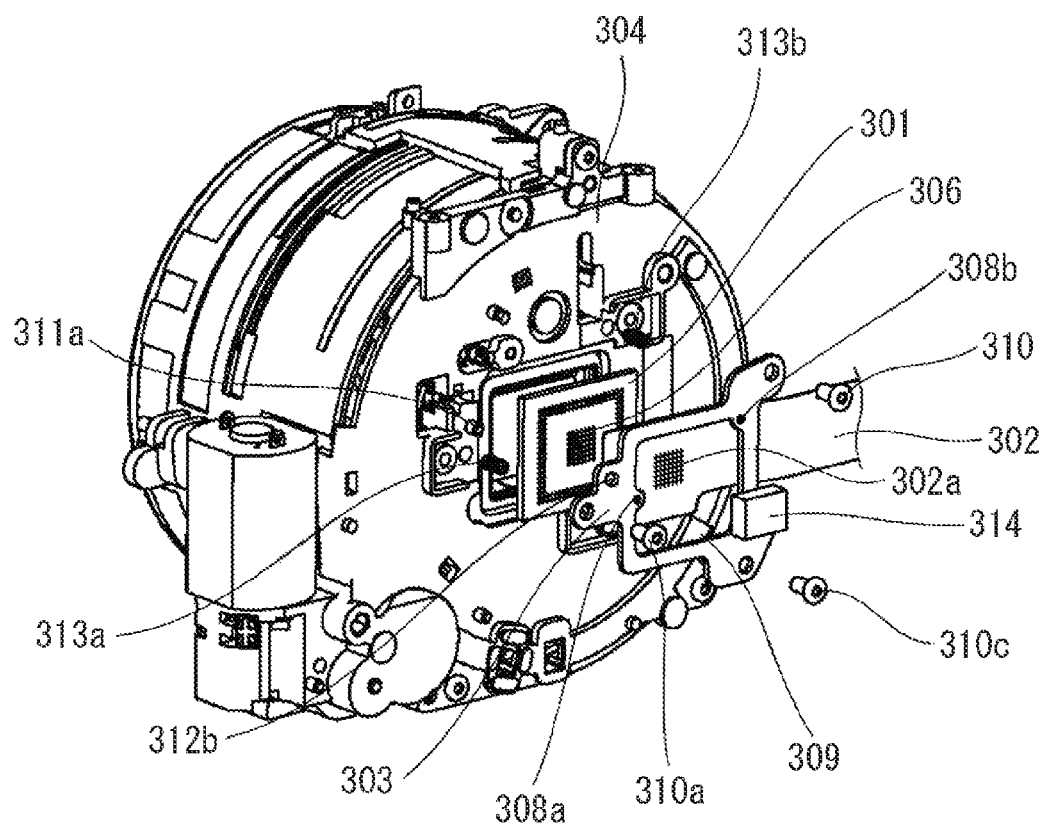
FIG. 16 is an exploded perspective view illustrating the imaging unit of the different configuration according to the first exemplary embodiment when viewed from the rear surface.

In this case, as illustrated in FIG. 16, a copper foil exposed pad (not illustrated) acting as a heat dissipation pad is provided at a position opposite the electrode 306 of a photoelectric conversion element package 301 of a printed circuit board 302. The copper foil exposed pad acting as a heat dissipation pad is connected to the electrode 306 for heat dissipation acting as a connection terminal. More specifically, when the photoelectric conversion element package 301 is reflow-mounted on the printed circuit board 302, solder balls forming the electrode 306 for heat dissipation are melted and firmly fixed to the copper foil exposed pad formed on the printed circuit board 302 before connection is established.

A rear surface heat dissipation pad 302a is formed on the rear surface of the printed circuit board 302 and the copper foil exposed pad and the rear surface heat dissipation pad 302a are connected by a through-hole inside the printed circuit board 302. Even when a heat conduction member 314 is configured to contact the rear surface heat dissipation pad 302a connected to the copper foil exposed pad, an effect similar to that in the first exemplary embodiment can be achieved.

Next, a second exemplary embodiment of the present invention will be described with reference to FIGS. 10 to 14.

Figure 10:
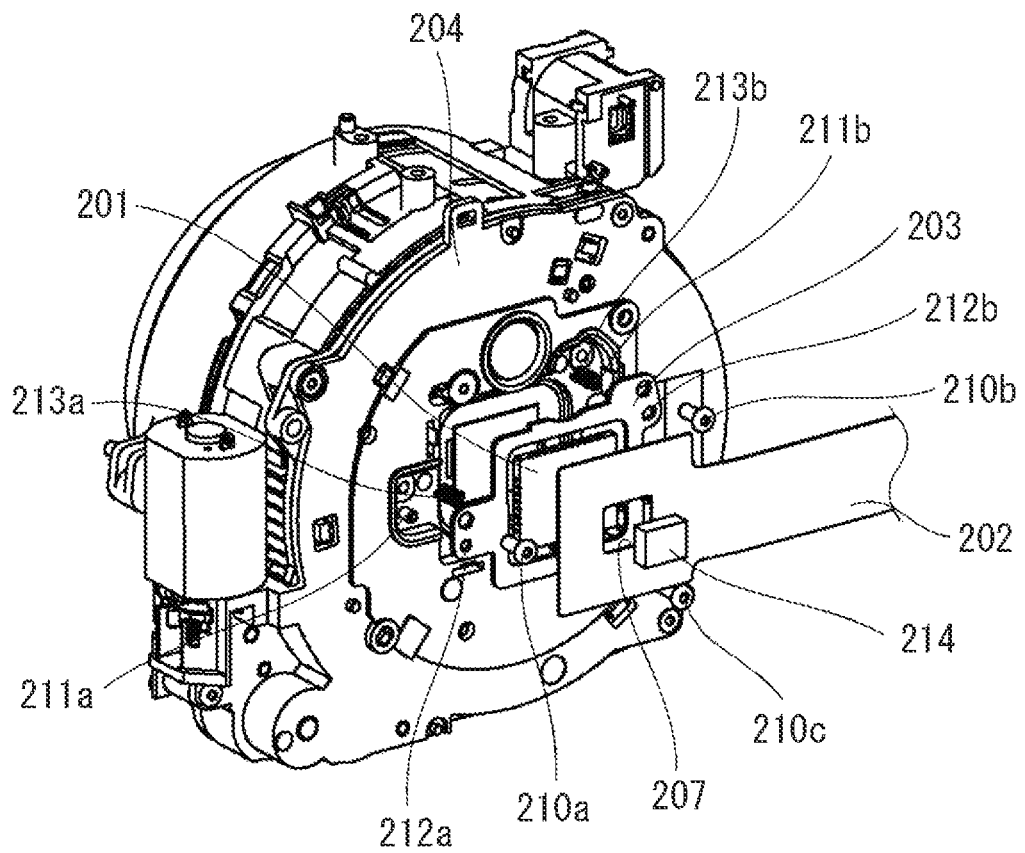
FIG. 10 is an exploded perspective view illustrating the imaging unit in the digital camera as the imaging apparatus according to a second exemplary embodiment of the present invention when viewed from the rear surface.
Figure 11:
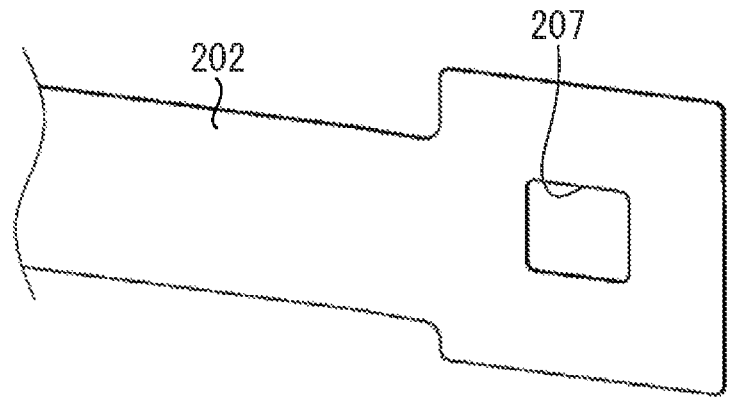
FIG. 11 is a perspective view illustrating a printed circuit board in the imaging unit of the digital camera according to the second exemplary embodiment.
Figure 12:
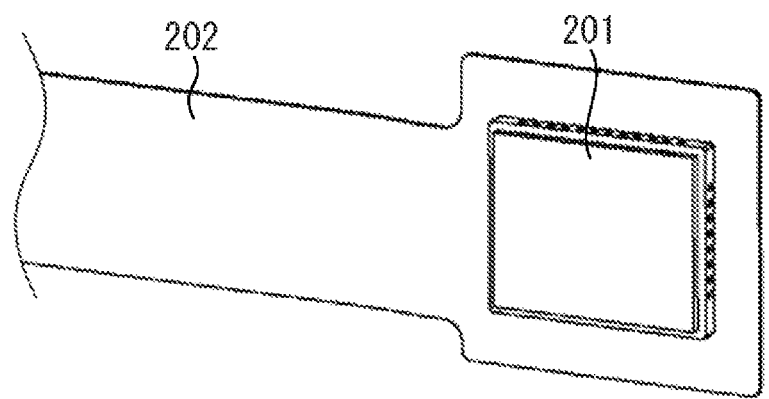
FIG. 12 is a perspective view illustrating the mounted state of the photoelectric conversion element package in the imaging unit of the digital camera according to the second exemplary embodiment.
Figure 13:
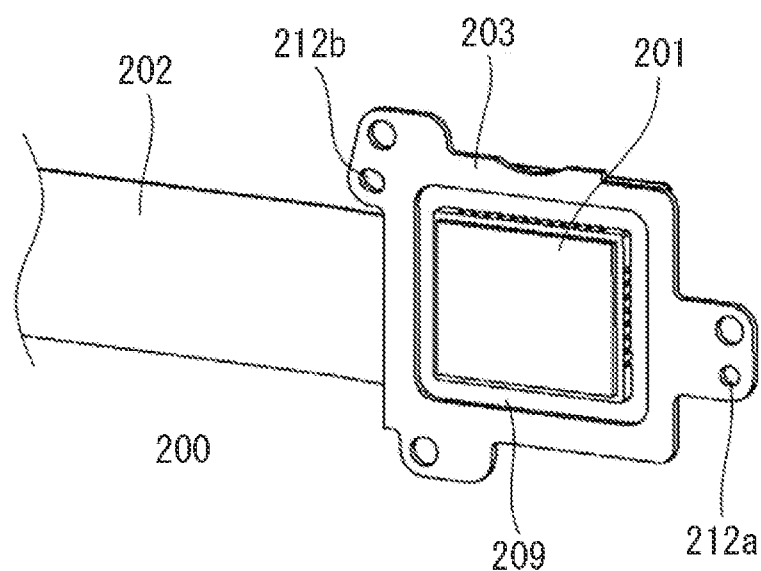
FIG. 13 is a perspective view illustrating a fixed state of the photoelectric conversion element package in the imaging unit of the digital camera according to the second exemplary embodiment and the fixing member.
Figure 14:
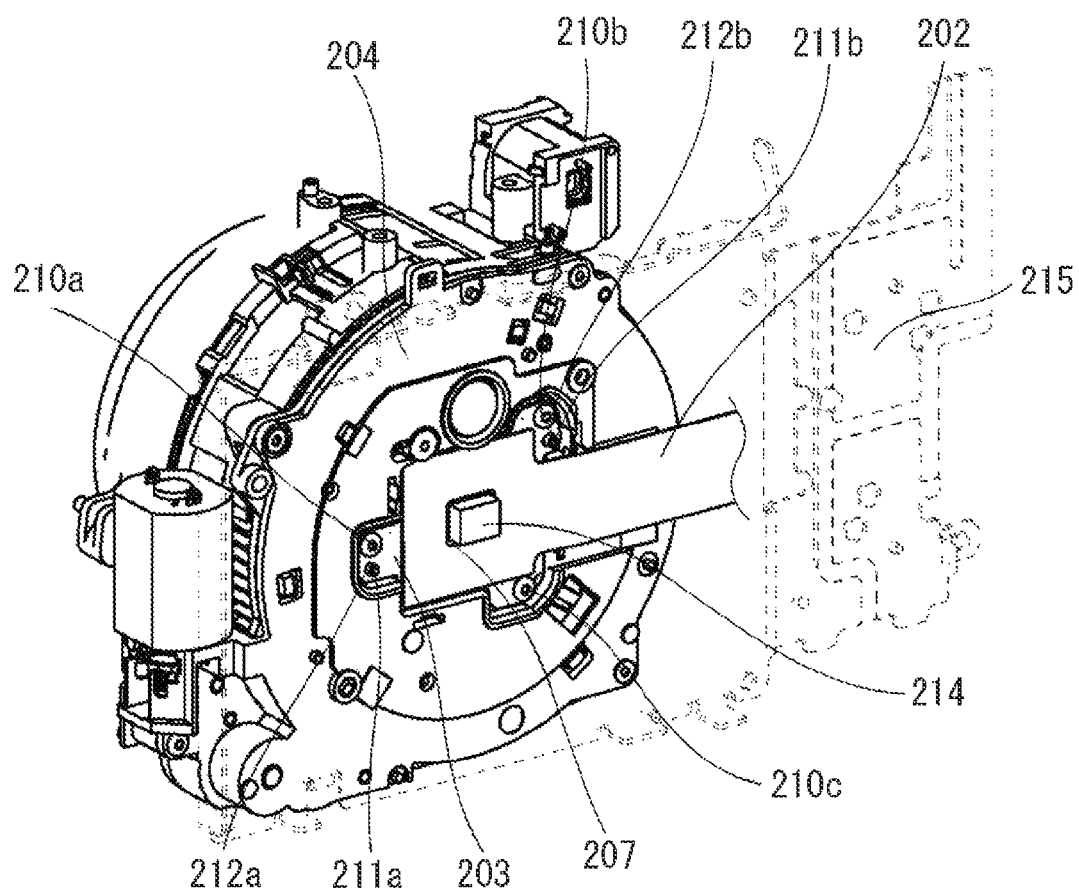
FIG. 14 is a perspective view illustrating the assembly complete state of the imaging unit of the digital camera according to the second exemplary embodiment.

FIG. 10 is an exploded perspective view illustrating the imaging unit in the digital camera as an imaging apparatus according to the second exemplary embodiment of the present invention when viewed from the rear surface. FIG. 11 is a perspective view illustrating a printed circuit board in the imaging unit of the digital camera according to the second exemplary embodiment. FIG. 12 is a perspective view illustrating the mounted state of the photoelectric conversion element package in the imaging unit of the digital camera according to the second exemplary embodiment. FIG. 13 is a perspective view illustrating a fixed state of the photoelectric conversion element package in the imaging unit of the digital camera according to the second exemplary embodiment and the fixing member. FIG. 14 is a perspective view illustrating the assembly complete state of the imaging unit of the digital camera according to the second exemplary embodiment.

The imaging unit mounted in the digital camera according to the second exemplary embodiment includes a photoelectric conversion element module unit 200 and a photographic lens barrel unit 204. The photoelectric conversion element module unit 200 includes a photoelectric conversion element package 201, a printed circuit board 202, and a fixing member 203.

An opening 207 is provided at a position corresponding to substantially the center portion of the photoelectric conversion element package in the mounting part of the photoelectric conversion element package 201 of the printed circuit board 202. Thus, a heat conduction member 214 is arranged to contact the rear surface of the photoelectric conversion element package 201 through the opening 207.

The heat conduction member 214 is a member formed of a heat-conductive gel material with flexibility in a rectangular solid shape.

Next, the configuration of the photoelectric conversion element module unit 200 will be described according to the assembly process with reference to FIGS. 11, 12, and 13.

As illustrated in FIG. 11, the photoelectric conversion element package 201 is reflow-mounted, like in the aforementioned first exemplary embodiment, in the opening formed as a mounting part of the printed circuit board 202 before being configured in a mounting complete state illustrated in FIG. 12.

The printed circuit board 202 according to the second exemplary embodiment has flexibility like in the first exemplary embodiment and thus is configured as a flexible printed circuit board.

As illustrated in FIG. 13, the photoelectric conversion element package 201 mounted on the printed circuit board 202 is fixed by the fixing member 203. The fixing member 203 is configured as a plate made of metal. An opening 209 is formed in the center portion of the fixing member 203.

The opening 209 is formed larger than the external shape of the photoelectric conversion element package 201 so that the photoelectric conversion element package 201 mounted on the printed circuit board 202 is arranged inside the opening 209.

In a fixing method for fixing the photoelectric conversion element package 201 and the fixing member 203, the relative position of each is determined by using a tool (not illustrated). Then, in this positioned state, an adhesive is poured into a gap between the opening 209 formed in the fixing member 203 and a package sidewall of the photoelectric conversion element package 201 positioned by the tool therewithin to fix the photoelectric conversion element package 201 and the fixing member 203.

Then, as illustrated in FIG. 14, the photoelectric conversion element module unit 200 is fastened to the photographic lens barrel unit 204 by screws 210a to 210c.

The photoelectric conversion element module unit 200 according to the second exemplary embodiment includes a mechanism to fine-adjust the position in the optical axis direction to the photographic lens barrel unit 204 and the angle to the optical axis. Moreover, the photoelectric conversion element module unit 200 includes a configuration by which the heat conduction member 214 is brought into contact with a main chassis 215.

According to the configuration of the photoelectric conversion element module unit 200 in the second exemplary embodiment described above, a photoelectric conversion element package and a fixing member can be positioned by deforming the heat conduction member 214 with high precision. Moreover, heat can be efficiently dissipated from a photoelectric conversion element with the configuration of the photoelectric conversion element module unit 200 without affecting inclination adjustments to the optical axis orthogonal plane of the photoelectric conversion element so that the rise in temperature of the photoelectric conversion element can be suppressed.

The heat conduction member 214 is arranged directly on the rear surface of the photoelectric conversion element package 201 in the second exemplary embodiment, but as illustrated in FIG. 15, a package in which the electrode 306 (heat dissipation portion) for heat dissipation, which is a connection terminal, is provided in the center portion on the rear surface of the photoelectric conversion element package may also be used.

Figure 17:
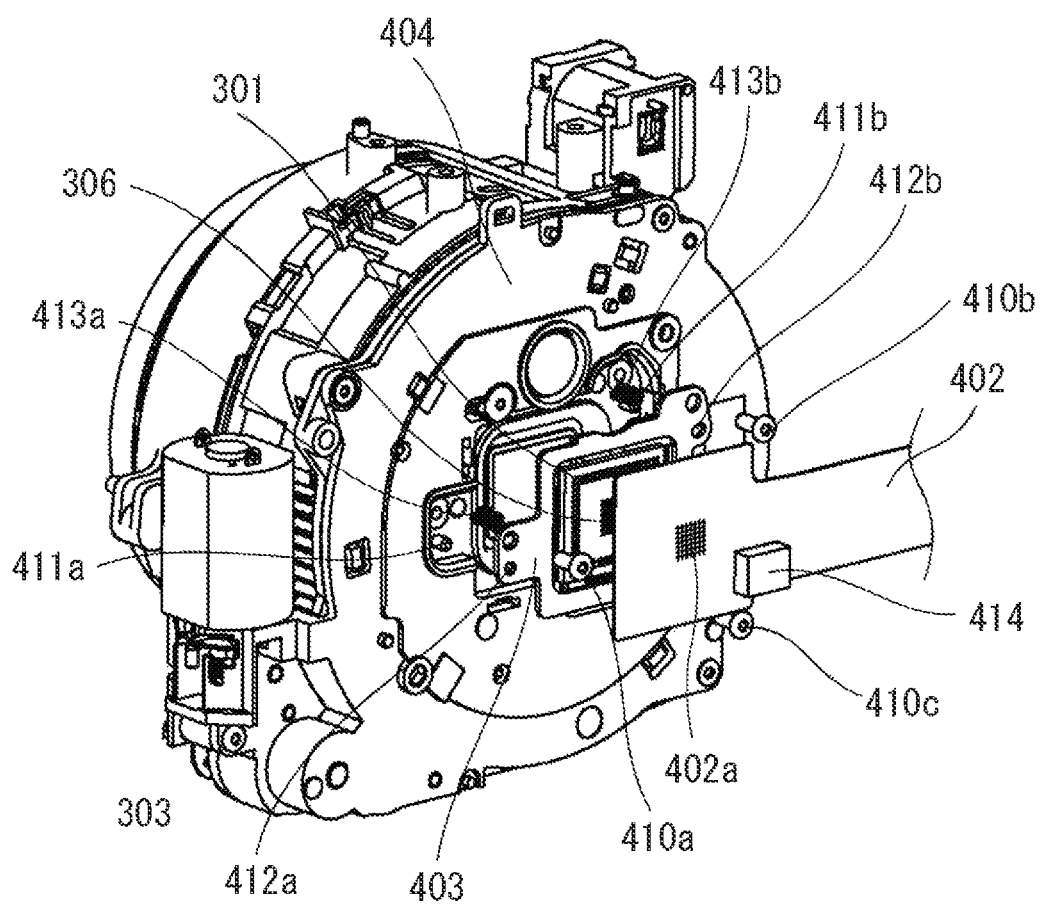
FIG. 17 is an exploded perspective view illustrating the imaging unit of the different configuration according to the second exemplary embodiment when viewed from the rear surface.

In this case, as illustrated in FIG. 17, a copper foil exposed pad (not illustrated) acting as a heat dissipation pad is provided at a position opposite the electrode 306 of the photoelectric conversion element package 301 of a printed circuit board 402. The copper foil exposed pad acting as a heat dissipation pad is connected to the electrode 306 for heat dissipation acting as a connection terminal. More specifically, when the photoelectric conversion element package 301 is reflow-mounted on the printed circuit board 402, solder balls forming the electrode 306 for heat dissipation are melted and firmly fixed to the copper foil exposed pad formed on the printed circuit board 402 before connection is established. A rear surface heat dissipation pad 402a is formed on the rear surface of the printed circuit board 402 and the copper foil exposed pad and the rear surface heat dissipation pad 402a are connected by a through-hole inside the printed circuit board 402. Even when a heat conduction member 414 is configured to contact the rear surface heat dissipation pad 402a connected to the copper foil exposed pad, an effect similar to that in the second exemplary embodiment can be achieved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-079209 filed Mar. 27, 2009, which is hereby incorporated by reference herein in its entirety.

What is claimed is:

1. An imaging apparatus comprising:
a photoelectric conversion element package;
a chassis member arranged at a position opposite to a rear surface of the photoelectric conversion element package;
a wiring member electrically connected to the photoelectric conversion element package, wherein the wiring member has a first opening that exposes the rear surface of the photoelectric conversion element package, and the wiring member is arranged between the rear surface of the photoelectric conversion element package and the chassis member;
a fixing member configured to fix the photoelectric conversion element package, wherein the fixing member has a second opening; and
a heat conduction member configured to contact the rear surface of the photoelectric conversion element package and the chassis member directly through the first and second openings,
wherein the heat conduction member is compressed and sandwiched between the photoelectric conversion element package and the chassis member.

2. The imaging apparatus according to claim 1,
wherein the second opening is larger than the first opening of the wiring member,
wherein the fixing member is adhesion-fixed to the rear surface of the photoelectric conversion element package, and
wherein the fixing member has a protruding portion configured to regulate the position of the photoelectric conversion element package by contacting the rear surface of the photoelectric conversion element package.

3. The imaging apparatus according to claim 2, wherein the protruding portion is formed at a position of the fixing member that contacts a portion of the rear surface of the photoelectric conversion element package outside the wiring member.

4. An imaging apparatus comprising:
a photoelectric conversion element package;
a chassis member arranged at an opposite side to a rear surface of the photoelectric conversion element package;
a wiring member electrically connected to the photoelectric conversion element package, wherein the wiring member has a first opening that exposes the rear surface of the photoelectric conversion element package, and the wiring member is arranged at the opposite side to the rear surface of the photoelectric conversion element package;
a fixing member configured to fix the photoelectric conversion element package; and
a heat conduction member configured to contact the rear surface of the photoelectric conversion element package and the chassis member directly through the first opening,
wherein the fixing member has a second opening larger than the first opening of the wiring member,
wherein the photoelectric conversion element package is arranged inside the second opening,
wherein the fixing member is adhesion-fixed to a package sidewall of the photoelectric conversion element package, and
wherein the wiring member covers at least a part of the rear surface of the photoelectric conversion element package and the fixing member.

5. The imaging apparatus according to claim 1, wherein the heat conduction member comprises a heat-conductive gel material.

6. An imaging apparatus comprising:
a photoelectric conversion element package having a heat dissipation portion formed on a rear surface thereof;
a chassis member arranged at a position opposite to the rear surface of the photoelectric conversion element package;
a wiring member having a heat dissipation pad in contact with the heat dissipation portion of the photoelectric conversion element package, the wiring member being arranged between the rear surface of the photoelectric conversion element package and the chassis member, and the wiring member being electrically connected to the photoelectric conversion element package;
a fixing member configured to fix the photoelectric conversion element package, wherein the fixing member has an opening; and
a heat conduction member configured to contact a rear surface of the heat dissipation pad of the wiring member and the chassis member directly through the opening,
wherein the heat conduction member is compressed and sandwiched between the rear surface of the heat dissipation pad and the chassis member.

7. The imaging apparatus according to claim 6,
wherein the heat dissipation pad and the rear surface of the heat dissipation pad are connected by a through-hole formed in the wiring member, and
wherein the heat conduction member contacts the rear surface of the heat dissipation pad of the wiring member and the chassis member directly through the opening.

8. The imaging apparatus according to claim 6,
wherein the fixing member has a protruding portion configured to fix the photoelectric conversion element package by contacting the rear surface of the photoelectric conversion element package, and
wherein the fixing member is adhesion-fixed to the rear surface of the photoelectric conversion element package.

9. The imaging apparatus according to claim 8, wherein the protruding portion is formed at a position of the fixing member that contacts a portion of the rear surface of the photoelectric conversion element package outside the wiring member.

10. The imaging apparatus according to claim 6,
wherein the opening larger than the photoelectric conversion element package,
wherein the fixing member being adhesion-fixed to a package sidewall of the photoelectric conversion element package, and
wherein the wiring member covers at least a part of the rear surface of the photoelectric conversion element package and the fixing member.

11. The imaging apparatus according to claim 6, wherein the heat conduction member comprises a heat-conductive gel material.

* * * * *